United States Patent
Osada et al.

(10) Patent No.: US 6,496,952 B1
(45) Date of Patent: Dec. 17, 2002

(54) SEMICONDUCTOR INTEGRATED CIRCUIT DEVICE, METHOD OF MANUFACTURING THE DEVICE, AND COMPUTER READABLE MEDIUM

(75) Inventors: Kenichi Osada, Kawasaki (JP); Koichiro Ishibashi, Warabi (JP); Kazuo Yano, Hino (JP); Tetsuro Honmura, Sagamihara (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/399,330

(22) Filed: Sep. 20, 1999

(30) Foreign Application Priority Data

Sep. 25, 1998 (JP) .......................................... 10-270891

(51) Int. Cl.$^7$ ............................................. G01R 31/28
(52) U.S. Cl. .................... 714/733; 365/194; 365/225.7; 365/201
(58) Field of Search .............................. 714/724, 733; 365/194, 200–201, 207, 222, 225.7, 49, 205, 230.06, 230.09; 711/105–106, 122, 167, 169

(56) References Cited

U.S. PATENT DOCUMENTS

| | | | | |
|---|---|---|---|---|
| 5,327,381 A | * | 7/1994 | Johnson et al. | 365/200 |
| 5,596,538 A | * | 1/1997 | Joo | 365/194 |
| 6,011,709 A | * | 1/2000 | Tanaka et al. | 365/49 |
| 6,295,593 B1 | * | 9/2001 | Hsu et al. | 711/169 |

OTHER PUBLICATIONS

J. Schütz et al.: A 450MHz IA32 P6 Family Microprocessor, ISSCC98 15/Microprocessors/Paper FP 15.4, 1998 IEEE International Solid–State Circuits Conference, pp. 236–237.
Schutz et al. (FP 15.4: A 450Mhz IA32 P6 Family Microprocssor; IEEE; Jan. 1998).*

* cited by examiner

Primary Examiner—David Ton
Assistant Examiner—Guy Lamarre
(74) Attorney, Agent, or Firm—Kenyon & Kenyon

(57) ABSTRACT

A semiconductor integrated circuit device, a method of manufacturing the device, and a medium for storing a processing procedure for deciding the number of delay circuits built in the device used for designing are disclosed. More particularly, a semiconductor integrated circuit device which guarantees the characteristics of writing into and reading from the built-in memory even when the manufacturing process conditions are varied is obtained. The semiconductor integrated circuit device is provided with a cache memory which includes a BIST circuit composed of a pattern generator, a pattern comparator, and an output register; a register controlled by a register control signal and a register write signal; a variable delay circuit controlled by the register; word lines, and a sense amplifier enable signal line. The timing for enabling the sense amplifier is changed and the memory is measured by the BIST, thereby deciding the optimal timing.

9 Claims, 7 Drawing Sheets

- 1. FUNCTIONAL SPECIFICATION, INTERFACE MODEL
- 2. DESIGN DATA
  - (1) MAT LAYOUT
  - (2) CONTROL CIRCUIT GATE DESCRIPTION

WORD DRIVER | MEMORY CELL ARRAY
  SENSE AMPLIFIER / WRITE AMPLIFIER
  +

- 3. TEST VECTOR
- 4. CHECK PROPERTY
  NET LIST FOR CIRCUIT SIMULATION
  TIMING ADJUSTMENT PROCEDURE
  SPECIFICATION CHANGE PROCEDURE
  PERFORMANCE ESTIMATION PROCEDURE

FIG. 7

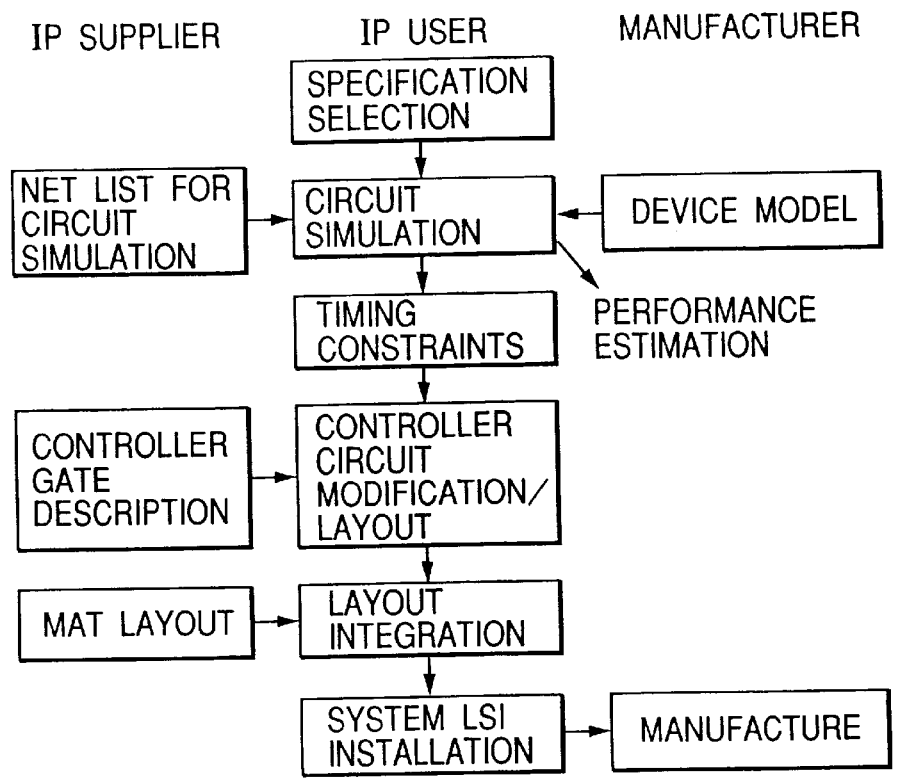

FIG. 8

```
. model n nmos LEVEL = 3
+ tox = 200 vto = 0.8 gamma = 0.7 uo = 600 kappa = 0.05
+ alpha = 1 vcr = 15 iirat = xiirat
```

FIG. 9

```
if     V(BL)-V(BLB)>100mV  when  V(SA_EN(a))=0.5Vdd
       V(BL)-V(BLB)>100mV  when  V(SA_EN(b))=0.5Vdd
       V(BL)-V(BLB)>100mV  when  V(SA_EN(c))=0.5Vdd
       SA_EN is connected to a else   V(BL)-V(BLB)>100mV  when  V(SA_EN(a))=0.5Vdd
       V(BL)-V(BLB)>100mV  when  V(SA_EN(b))=0.5Vdd
       V(BL)-V(BLB)>100mV  when  V(SA_EN(c))=0.5Vdd
       SA_EN is connected to b else   V(BL)-V(BLB)>100mV  when  V(SA_EN(a))=0.5Vdd
       V(BL)-V(BLB)>100mV  when  V(SA_EN(b))=0.5Vdd
       V(BL)-V(BLB)>100mV  when  V(SA_EN(c))=0.5Vdd
       SA_EN is connected to c
```

SEMICONDUCTOR INTEGRATED CIRCUIT DEVICE, METHOD OF MANUFACTURING THE DEVICE, AND COMPUTER READABLE MEDIUM

FIELD OF THE INVENTION

The present invention relates to a semiconductor integrated circuit device provided as an IP (Intellectual Property), etc., a method of manufacturing the device, and a medium of storing a processing procedure for deciding the number of delay circuits integrated in the semiconductor integrated circuit device used for designing the device, more particularly to a semiconductor integrated circuit device which guarantees the properties for writing in and reading from a memory provided therein, as well as a method of manufacturing the device and a medium used when in designing the device.

BACKGROUND OF THE INVENTION

In the case of conventional cache memories, data is read from the bit lines driven with a weak current of each memory cell and the weak signal is amplified by a sense amplifier.

Usually, when a potential difference between two bit lines is 100 mV, the sense amplifier is enabled. However, because the time of reading from such a cache memory is less when the sense amplifier is enabled with a potential difference lower than 100 mV, the performance of the cache memory is improved. If the sense amplifier is enabled with an extremely small potential difference, however, the amplification will malfunction; a correct value is not amplified and a wrong value is output if the current in a memory cell is reduced with a process variation or if an offset occurs in the threshold voltage of an input MOS transistor of the sense amplifier. More concretely, it is very important to decide the time for enabling the sense amplifier when in designing.

Conventionally, the timing for enabling the sense amplifier is changed and measured, thereby deciding the optimized timing by processing the metallic line of the sense amplifier with the use of a focused ion beam (FIB) after a trial cache memory is formed on a silicon wafer. If the FIB is used, however, only one timing is set for one chip. In addition, a whole day is required for the processing.

On the other hand, a conventional well-known technique for such a timing decision is disclosed in ICCSS Digest of Technical Papers (pp.236–237) 1998. This document describes that the timing of the object programmable cache memory is changed after the manufacturing.

Although conventional example publicly known is only in theory and unworkable in practice, the present inventor et al has found, as a result of a preliminary examination that a long time is required for testing the memory from external in the on-chip timing adjustment on the basis of the conventional technique and this causes many processes to be needed for finding operation conditions of the object LSI.

More concretely, there has been no well-known means for operating an LSI provided with an on-chip memory using an element whose process condition is uncertain so as not to be controlled (or to be controlled less) from external (ex., an IC tester).

Furthermore, there is no well-known method for adjusting such a timing to a production variation after the chip is manufactured if a CPU, a cache memory, and a DRAM used as a secondary cache are used together.

SUMMARY OF THE INVENTION

Under such the circumstances, it is an object of the present invention to compose a semiconductor integrated circuit device provided with such a memory as an SRAM so as to further include a plurality of delay circuits for delaying a sense amplifier enable signal from a clock signal respectively and means for deciding the minimum number of delay circuits for assuring the normal operation of the memory.

Furthermore, it is another object of the present invention to compose a semiconductor integrated circuit device, wherein the means for deciding the minimum number of delay circuits is a CPU which can change the number of delay circuits, write a predetermined value in each cell of the memory, read the written value and compare it with the written value, thereby confirming the normal operation of the memory, then decide the minimum number of delay circuits from among the delay circuit numbers, each of which assures the normal operation of the memory.

Furthermore, it is further another object of the present invention to compose a semiconductor integrated circuit device, wherein the CPU includes a BIST circuit for testing the memory, and the BIST circuit comprises a pattern generator for generating addresses and write data, a pattern comparator for comparing written data with read data, and an output register for outputting the comparison result.

Furthermore, it is further another object of the present invention to compose a semiconductor integrated circuit device, wherein each of the delay circuits comprises an inverter delay circuit and a delay circuit number selector circuit. The delay circuit number selector circuit comprises a register for storing a delay circuit selected number written by the CPU, and a decoder circuit for reading the delay circuit selected number stored in the register, thereby controlling the number of inverter circuits. The delay circuit further includes another circuit for fixing the number of delay circuits by blowing off a fuse after deciding the minimum number of delay circuits.

It is further another object of the present invention to provide a method for manufacturing the above semiconductor integrated circuit device, where in the CPU selects a change of the number of the delay circuits, confirms the normal operation of each cell of the memory, decide s the optimized number of the delay circuits, and fixes the number of the delay circuits by blowing off a fuse, or by other means after the circuits of the semiconductor integrated circuit device are formed.

Because the IP supplier composes a computer readable medium for storing net list data for circuit simulation of the above semiconductor integrated circuit device provided with a memory, as well as a medium for storing a processing procedure for deciding the number of delay circuits integrated in the semiconductor integrated circuit device so as to optimize the timing for delaying the sense amplifier enable signal from a clock signal according to a result of circuit simulation of the semiconductor integrated circuit device and the IP user uses the medium, it is possible to make it easier to design an LSI peculiar to the IP user.

BRIEF DESCRIPTION OF THE DRAWINGS

FIG. 7 is a flowchart of a design made by an IP user in accordance with the third embodiment of the present invention.

FIG. 8 is a device model in accordance with the third embodiment of the present invention.

FIG. 9 shows conditional statements in accordance with the third embodiment of the present invention.

DETAILED DESCRIPTION OF THE PREFERRED EMBODIMENTS

Hereunder, some of the preferred embodiments of a semiconductor integrated circuit device in accordance with the present invention will be described with reference to the accompanying drawings.

First Embodiment

Figure 1:
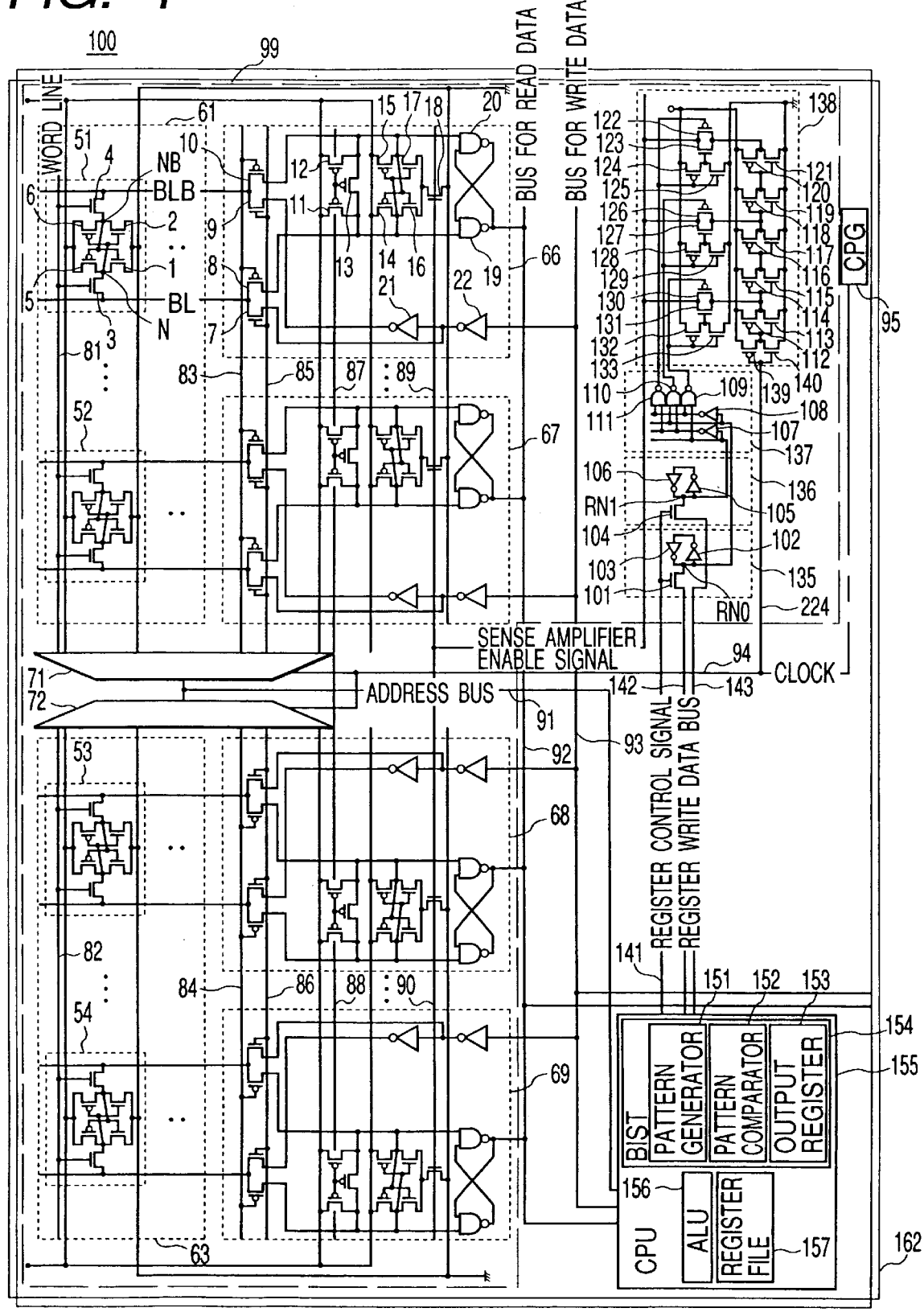
FIG. 1 is a circuit diagram of a semiconductor integrated circuit device in accordance with the first embodiment of the present invention.

FIG. 1 is a circuit diagram of a semiconductor integrated circuit device in an embodiment in accordance with the present invention. A processor 100 which is a semiconductor device is formed on a semiconductor substrate formed of single crystal silicon with the use of a semiconductor integrated circuit device manufacturing technique. The semiconductor integrated circuit device comprises a plurality of memory cells (51 to 54) disposed like a matrix (rows and columns) so as to compose memory arrays (61, 63).

A memory cell 51 comprises a flip-flop (comprising P-channel MOS transistors (5, 6) and N-channel transistors (1, 2)) composed of a pair of CMOS inverters whose input and output are connected to each other and N-channel MOS transistors (3, 4) for connecting both storage nodes N and NB of the flip-flop to the bit lines (BL, BLB) selectively. A word line 81 is connected to the gate electrode of the N-channel MOS transistor (3, 4).

Furthermore, column circuits (66 to 69) composed of a sense amplifier/latching circuit, write amplifiers (21, 22), precharging circuits (11, 12, 13), and a Y-switch circuit respectively are disposed side by side vertically.

The sense amplifier/latching circuit comprises a flip-flop composed of P-channel MOS transistors (14, 15) and N-channel MOS transistors (16, 17), a latching sense amplifier composed of an N-channel MOS transistor 18 for disabling the sense amplifier, and a latching circuit composed of NAND circuits (19, 20).

The Y-switch circuit is composed of P-channel MOS transistors (8, 10) for connecting the bit lines (BL, BLB) to the sense amplifier and N-channel MOS transistors (7, 9) for connecting the bit lines (BL, BLB) to the write amplifiers (21, 22) respectively. The control signals (83, 84) are used to control the P-channel MOS transistors (8, 10) and the control signals (85, 86) are used to control the N-channel MOS transistors (7, 9).

The P-channel MOS transistor is turned on when in reading data and the N-channel MOS transistors (7, 9) are turned on when in writing data.

The address bus is connected to the decoder circuit (71, 72) disposed in the center between the two memory arrays (61, 63), so that the clock signal 94 is entered to the decoder circuit (71, 72). A word line (81, 82) is thus selected according to the entered address. A signal (87, 88) for controlling a precharging circuit (11, 12, 13) is generated from the clock signal 94. The sense amplifier enable signal (89, 90) is entered to the center between the two memory arrays (61 and 63) and connected to the gate electrode of the N-channel MOS transistor 18 for controlling enabling of the sense amplifier.

The sense amplifier enable signal (89, 90) delays and generates the clock signal 94, which is delayed by the delay circuit 138. The delay circuit 138 comprises an inverter delay circuit composed of P-channel MOS transistors (112, 114, 116, 118, 120, 139) and N-channel MOS transistors (113, 115, 117, 119, 121, 140), and a delay circuit number selector circuit composed of P-channel MOS transistors (122, 124, 126, 128, 130, 132) and N-channel MOS transistors (123, 125, 127, 129, 131, 133). The value stored in the register (135, 136) is decoded by the decoder circuit 137 so as to control the delay selector circuit.

The decoder circuit 137 comprises NAND circuits (109, 110, and 111) and inverter circuits (107 and 108). The register (135, 136) comprises inverters (102 and 103, 105 and 106) and an N-channel MOS transistor (101, 104). Data written in the register (135, 136) is transferred to the bus (142, 143). The register control signal 141 is used to control the writing into the register (135, 136). This completes the description for the configuration of the on-chip cache memory 99.

The bus for read data 92 and the bus for write data 93 are formed along the column circuits (66, 67, 68, and 69). The clock signal 94 is generated by the clock generator circuit 95.

In addition to the cache memory described above, the processor is also provided with a CPU 155. The CPU 155 includes a computing element 156, a register file 157, and a BIST circuit 154 (built-in self-testing circuit) for testing the cache memory. The BIST 154 comprises a pattern generator 151 for generating addresses and write data, a pattern comparator 152 for comparing written data with read data, and an output register 153 for outputting the comparison result. An I/O and I/O control circuit 162 is also disposed on the processor so as to go around the chip.

Next, the (read and write) operations of the cache memory 99 will be described.

Figure 2:
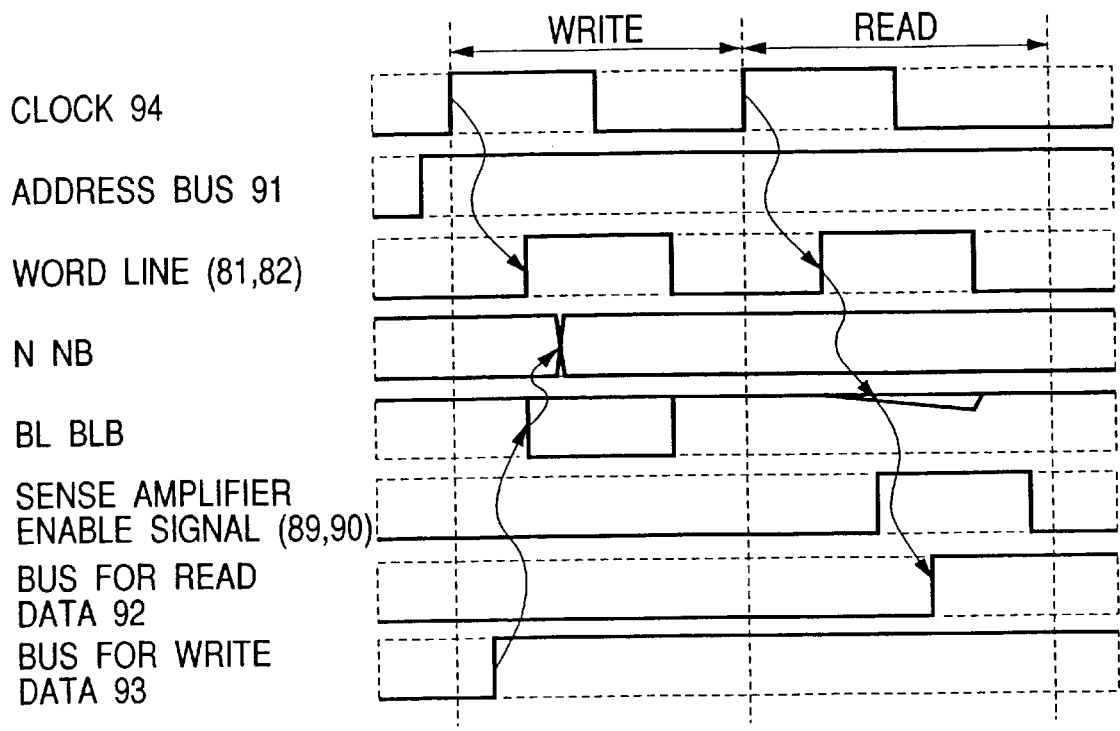
FIG. 2 is operation waveforms of the semiconductor integrated circuit device in accordance with the first embodiment of the present invention.
Figure 3:
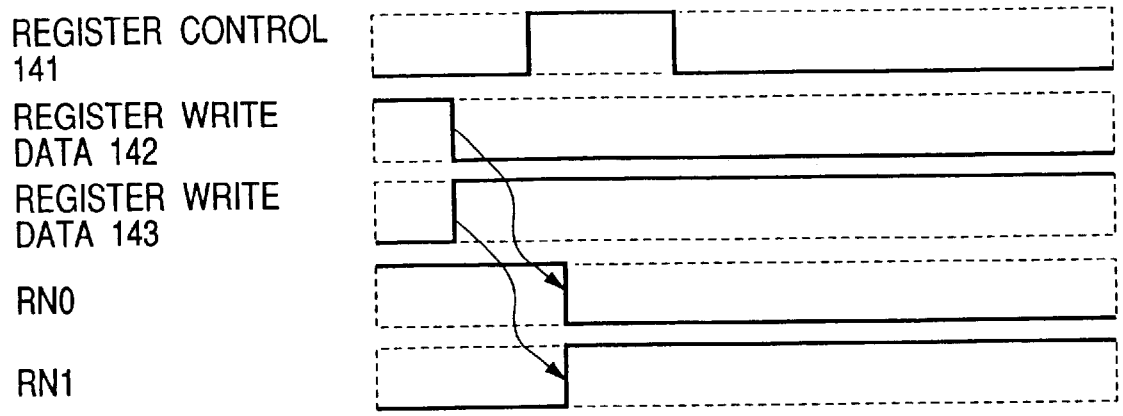
FIG. 3 is operation waveforms of the semiconductor integrated circuit device in accordance with the first embodiment of the present invention.

FIG. 2 shows the waveforms of the write and read operations of the cache memory 99 of the semiconductor integrated circuit device shown in FIG. 1.

Data is written in the cache memory as follows: When the clock is driven into "H" ("HIGH" level), the data output by the CPU onto the address bus 91 is fetched into the cache memory, then decoded, so that the word line (81, 82) corresponding to the address is driven into "H". Simultaneously, the written data is output to the write data bus 93, so that the control signal (85, 86) is driven into "H". The bit lines (BL, BLB) are thus driven, thereby inverting the value of the storage node (N, NB) of the memory cell 51 and the data is written in the memory cell 51.

On the contrary, data is read from the cache memory as follows: The data output by the CPU onto the address bus 91 is fetched into the cache memory when the clock is driven into "H" ("HIGH" level), then the data is decoded, thereby the word line (81, 82) corresponding to the address is driven into "H". Consequently, a potential difference is generated between the bit lines (BL and BLB) due to the data stored in the memory cell 51 and the control signal (83, 84) is driven into "H". The signal is thus transferred to the sense amplifier. When the potential difference between the bit lines (BL and BLB) reaches 100 mV, the amplifier enable signal (89, 90) is driven into "H", thereby this potential difference is amplified and the amplified potential difference is output to the data bus 92 so as to complete the reading from the cache memory.

Although the potential difference between the bit lines (BL and BLB) is 100 mV for driving the sense amplifier enable signal (89, 90) into "H" in the above case, the optical timing for driving the sense amplifier enable signal (89, 90) into "H" is changed actually due to the process condition, etc. if the above-mentioned semiconductor device 100 is formed on a silicon wafer. After a trial manufacture, therefore, the following processing is carried out so as to decide the optimal timing.

At first, the CPU 155 sets necessary data in the register (136, 137). Next, how to write data in the register (135, 136) of the semiconductor integrated circuit device shown in FIG. 1 will be described.

At first, the CPU 155 outputs the value to be written in the register (135, 136) to the register write data bus (142, 143). Then, the CPU 155 drives the register control signal 141 into "H", thereby writing the value of the register write data bus (142, 143) into the register (135, 136). The data is thus stored in the storage nodes RN0 and RN1 of the register (135, 136). When the data is stored in those nodes RN0 and RN1, the control signal 141 is driven into "L" ("LOW" level).

If "L" is stored in both of the storage nodes RN0 and RN1, the clock 94 passes the 6 delay inverters (112 to 121) and becomes the sense amplifier enable signal (89, 90).

If "H" and "L" are stored in the storage nodes RN0 and RN1 respectively, the clock 94 passes 4 delay inverters (112 to 117) and becomes the sense amplifier enable signal (89, 90).

If "L" and "H" are stored in the storage nodes RN0 and RN1 respectively, the clock 94 passes 2 delay inverters (112, 113) and becomes the sense amplifier enable signal (89, 90).

At first, "L" is stored in both of the storage nodes RN0 and RN1 so as to delay the sense amplifier enable signal (89, 90) by a time period of 6 inverters from the clock signal 94. Then, the pattern generator 151 of the BIST 154 generates an address and write data, then writes a value, for example, "0" in all the memory cells (51 to 54) of the cache memory 99. After that, the values from all those memory cells are read and compared with the written data in the pattern comparator 152. In other words, it is checked here whether or not the read value is "0". If all the read values are "0", it is judged that the cache memory operation is normal. The output register 153 is thus notified of the normal operation.

Next, "H" and "L" are stored in the storage nodes RN0 and RN1 so as to delay the sense amplifier enable signal (89, 90) by a time period of 4 inverters from the clock signal 94. Then, the pattern generator 151 of the BIST 154 generates an address and write data, then writes a value, for example, "0" in all the memory cells (51 to 54) of the cache memory 99. After that, the values from all those memory cells are read and compared with the written data in the pattern comparator 152. If all the read values are not "0", it is judged that the cache memory operation is abnormal. This means that the 4 delay inverters (112 to 117, 139 and 140) are not enough. In other words, 6 delay inverters (112 to 121, 139 and 140) are required in this case.

If all the read values are "0", the cache memory operation is normal. At this time, "L" and "H" are stored in the storage nodes RN0 and RN1 respectively, and the pattern generator 151 of the BIST 154 generates an address and write data, then writes a value, for example, "0" in all the memory cells (51 to 54) of the cache memory 99. After that, the values from all those memory cells are read. If all the read values are not "0", it is judged that the cache memory operation is abnormal. This means that the 2 delay inverters (112, 113, 139, 140) are not enough. In other words, 4 delay inverters (112 to 117, 139, 140) are required in this case.

If all the read values are "0", the cache memory operation is normal and this means that the optimal number of delay inverters is two (112, 113, 139, 140).

The minimum number of delay inverts can be decided as described above. And, if the optimal number of inverters is decided, the storage nodes RN0 and RN1 are short-circuited to the supply voltage (VDD) or the ground potential (GND), thereby the number of inverters is fixed.

Second Embodiment

In the first embodiment, after a trial manufacture, the optimal timing had to be decided and the mask had to be modified, thereby manufacturing the semiconductor integrated circuit device again. In this embodiment, however, after the real manufacture, the optimal timing is decided just like in the first embodiment, then a fuse is blown off, thereby fixing the register (135, 136) to the supply voltage (VDD) or the ground potential (GND) and fixing the sense amplifier enable signal (89, 90). The object chip can thus have the optimized sense amplifier signal (89, 90).

Hereunder, the second embodiment of the present invention will be described with reference to FIG. 4.

Figure 4:
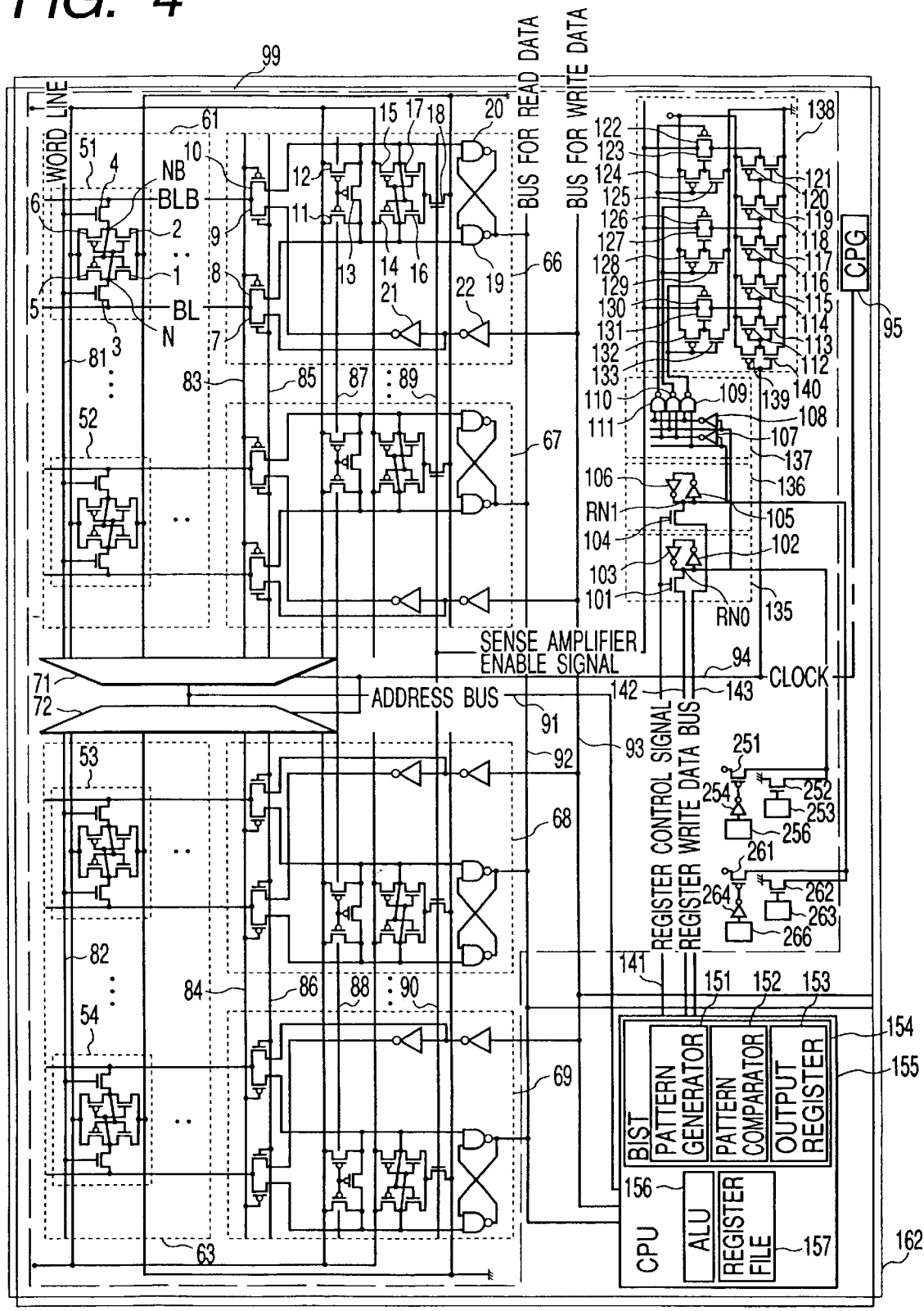
FIG. 4 is a circuit diagram of the semiconductor integrated circuit device in accordance with the second embodiment of the present invention.

The semiconductor device shown in FIG. 4 is provided with the circuits shown in FIG. 1 so as to fix the storage nodes (RN0, RN1) of the register (136, 136) by the use of a fuse.

One of the circuits is used to turn on the N-channel MOS transistor 252, thereby fixing the storage node RN0 to the ground potential (GND) if the fuse 253 is blown off.

Another circuit is used to turn on the P-channel MOS transistor 251 via the inverter circuit 254, thereby fixing the storage node RN0 to the supply potential (VDD) if the fuse 256 is blown off.

Further another circuit is used to turn on the N-channel MOS transistor 262, thereby fixing the storage node RN1 to the ground potential (GND) if the fuse 263 is blown off.

Further another circuit is used to turn on the P-channel MOS transistor 261 via the inverter circuit 264, thereby fixing the storage node RN1 to the power supply potential (VDD) if the fuse 266 is blown off.

Instead of the fuse, a flash memory may be used.

With the use of the above means, it is possible to obtain a chip provided with the optimal sense amplifier enable signal (89, 90) without modifying the mask even when the process is varied among chips.

Third Embodiment

If the cache memory 99 in the first embodiment is formed with a different process so as to be used for a different processor as an IP, the timing for driving the sense amplifier enable signal (89, 90) into "H" will not be adjusted enough with the processing in the first embodiment. (The IP is a block of functions collected in a state of the hardware or software required for composing a logic LSI. In this embodiment, the IP supplier supplies the IP to an IP user in the form of the information shown in FIG. 6). In order to avoid this, therefore, the timing should be adjusted roughly in the designing stage. However, if a cache memory is used as an IP, the IP user should preferably be able to adjust the timing easily even when the IP user does not know the details of the cache memory. This is why a delay circuit 200 is provided for the circuit shown in FIG. 1. The delay circuit 200 comprises 6 inverters composed of N-channel MOS transistors (213, 215, 217, 219, 221, and 223) and P-channel MOS transistors (212, 214, 216, 218, 220, and 222) respectively. The clock 94 is entered to the first inverter (212, 213). The number of delay circuits to be used for delaying the clock is decided by a joint (a, b, c) to which the signal 224 is connected.

For example, if the signal 224 is connected to the joint b, the clock signal 94 passes 4 inverters (212 to 219) and enters the delay circuit 138. The IP user thus carries out the following processing so as to decide a joint (a, b, c) to which the signal 224 is to be connected in the design stage.

Figure 5:
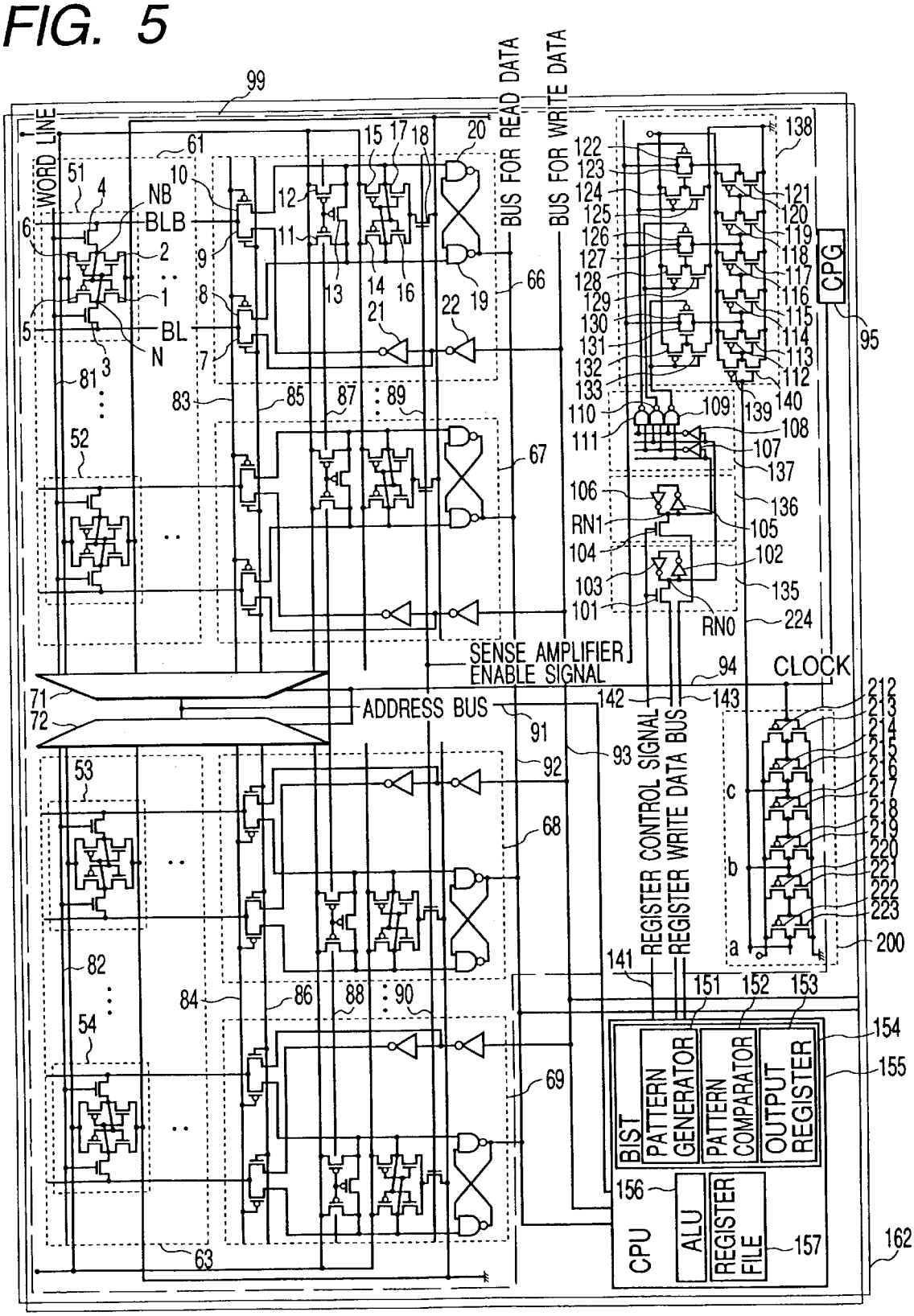
FIG. 5 is a circuit diagram of the semiconductor integrated circuit device in accordance with the third embodiment of the present invention.
Figure 6:
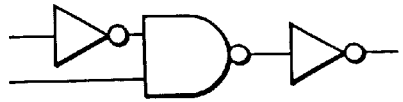
FIG. 6 is items supplied by the IP manufacturer in accordance with the third embodiment of the present invention.

FIG. 6 shows items to be supplied from the IP supplier to IP users. The items are a cache functional specification, an interface model, design data, test vectors, and check properties. The design data includes layout data consisting of a word driver, a sense amplifier/write amplifier, and a memory cell array, as well as a control circuit gate description for controlling the cache memory. The check properties includes a net list for the circuit simulation of a cache critical path, a timing adjustment procedure which describes one of the joints a, b, and c shown in FIG. 5, which is used to connect the signal 224, a specification change procedure, and a performance estimation procedure. The net list for circuit simulation, a procedure for deciding the number of delay circuits, or a program for deciding the number of delay circuits are recorded together in a medium or separately in media, then supplied to the object IP user.

FIG. 7 is a flowchart for an IP user to install a cache IP in the object LSI in accordance with the timing specification. The IP user decides the specifications of the object IP so as to select the IP. The IP user makes a circuit simulation with the use of a net list for circuit simulation supplied from the IP supplier and a device model supplied from the manufacturer. The device model, as shown in FIG. 8, consists of the gate oxide film thickness (tox) of a transistor and parameters indicating such characteristics of the transistor as a threshold voltage (vto), etc. As a result of simulation, a joint (a, b, c) to which the signal line 242 shown in FIG. 5 is to be connected is decided in accordance with the conditional statement shown in FIG. 9 as an example, then output as a timing constraint. The conditional statement consists of a statement for comparing a time at which the sense amplifier enable signal takes a half value of a supply voltage (for example, when V(SA_EN(a))=0.5 Vdd indicates a time at which the sense amplifier enable signal takes a half value of a supply voltage (0.5 Vdd) when the signal line 242 shown in FIG. 5 is connected to a) with a time at which the potential difference between the bit lines (BL and BLB) exceeds 100 mV.

The control circuit gate description supplied from the IP supplier is modified according to the timing constraint information, thereby laying out the control circuit. This layout is put together with the mat layout, then integrated in the object LSI and the manufacture of the LSI is asked to a manufacturer.

The above method will thus make it possible for the IP user who is not a cache designer to materialize a high performance cache memory in a different process.

Fourth Embodiment

Figure 10:
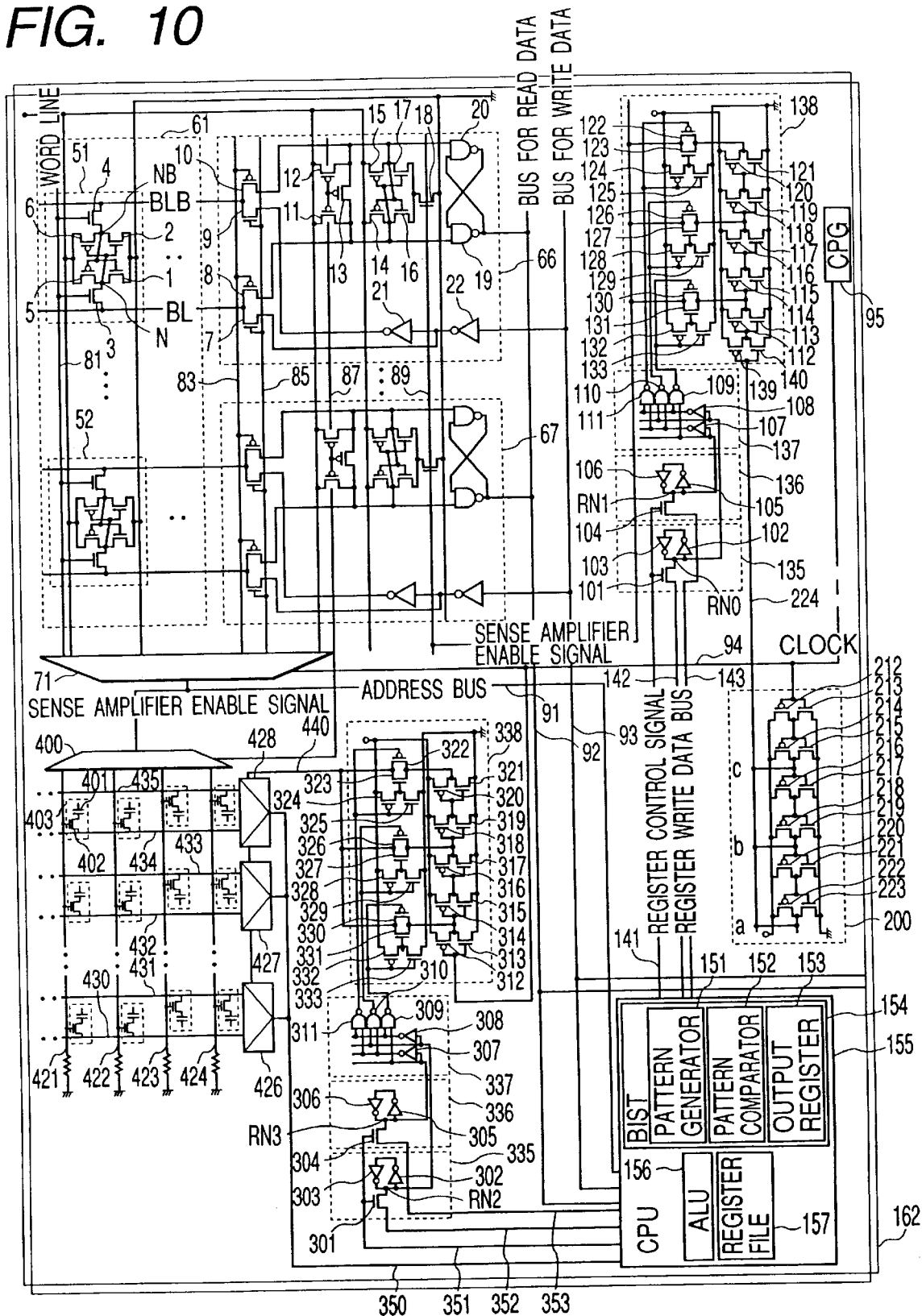
FIG. 10 is a circuit diagram of the semiconductor integrated circuit device in accordance with the fourth embodiment of the present invention.

In the above embodiments, one memory circuit is formed on one chip. FIG. 10 shows another case in which a plurality of memories are formed on one chip. When compared with the semiconductor device provided with an on-chip cache memory shown in FIG. 5, the semiconductor device shown in FIG. 10 is provided with more circuits such as a DRAM and a control circuit for the sense amplifier enable signal. The DRAM comprises memory cells 403 disposed like an array. Each memory cell is composed of an N-channel MOS transistor 402 and a capacitor 401 for storing data by accumulating the charge. A word line 421 is connected to the gate electrode of the N-channel MOS transistor 402. And, a bit line 434 is connected to the drain electrode. The bit lines (435, 434) are paired and data on those bit lines is amplified in the sense amplifier 428 and output to the data bus 350. The sense amplifier enable signal (440) is entered to the sense amplifier (426, 427, 428). An address decoder 400 is also disposed on the DRAM.

The clock 94 is delayed by the delay circuit 338, thereby generating the sense amplifier enable signal (440). The delay circuit 338 comprises an inverter delay circuit composed of P-channel MOS transistors (312, 314, 316, 318, 320, and 339) and N-channel MOS transistors (313, 315, 317, 319, 321, 340), as well as a delay circuit number selector circuit composed of P-channel MOS transistors (322, 324, 326, 328,330, 332) and N-channel MOS transistors (323, 325, 327, 329, 331, 333). The decoder circuit 337 decodes the value stored in the register (335, 336), thereby controlling the delay number selector circuit.

The decoder circuit 337 comprises NAND circuits (309, 310, 311) and inverter circuits (307, 308). The register (335, 336) comprises inverters (302 and 303, 305 and 306) composing a flip-flop and an N-channel MOS transistor (301, 304) for controlling receiving and writing from/into the flip-flop circuit. The bus (352, 343) transfers the data to be written in the register (335, 336). The signal 351 is used to control the writing into the register (335, 336). The method for adjusting the timing for enabling the sense amplifier enable signal (440) is the same as that shown in the first embodiment.

According to the present invention, therefore, it is possible to operate the LSI provided with an on-chip memory whose process conditions are uncertain quickly and fast so as not to be controlled (or controlled less) from external (ex., an IC tester).

Furthermore, it is also possible to correct a chip which malfunctions due to a varied process condition.

What is claimed is:

1. A semiconductor integrated circuit device comprising:

a plurality of bit lines and word lines;

a plurality of memory cells coupled to said bit lines and word lines;

a sense amplifier circuit coupled to said bit lines;

a plurality of delay circuits for delaying a sense amplifier enable signal from a clock signal respectively; and means for deciding the minimum number of said delay circuits which assures the normal operation of said memory cells with a change of the number of said delay circuits through confirmation of the normal operation of each memory cell.

2. A semiconductor integrated circuit device in accordance with claim 1, wherein said means for deciding the minimum number of said delay circuits is a CPU which can change the number of said delay circuits, write a predetermined value in each memory cell, read the value written in each memory cell, and compare said read value with said written value, and then decide the minimum number of delay circuits from a result of said confirmation.

3. A semiconductor integrated circuit device in accordance with claim 2, wherein said memory comprises either or both of a cache memory and a DRAM.

4. A semiconductor integrated circuit device in accordance with claim 2, wherein said CPU includes a BIST circuit for testing said memory block;

said BIST circuit comprises:

a pattern generator for generating an address and write data, a pattern comparator for comparing written data with read data, and an output register for outputting a result of comparison.

5. A semiconductor integrated circuit device in accordance with claim 1, wherein each of said delay circuits comprises:

an inverter delay circuit; and a delay circuit number selector circuit.

6. A semiconductor integrated circuit device in accordance with claim 5, wherein said delay circuit number selector circuit comprises:

a register for storing a delay circuit selected number written by said CPU, and a decoder circuit for reading said delay circuit selected number stored in said register, thereby controlling the number of said inverter delay circuits.

7. A semiconductor integrated circuit device in accordance with claim 1, wherein said semiconductor integrated circuit device further includes a circuit for fixing the number of delay circuits by blowing a fuse after deciding said minimum number of delay circuits.

8. A semiconductor integrated circuit device in accordance with claim 1, wherein said semiconductor integrated circuit device further includes means for storing the number of delay circuits in a flash memory after deciding said minimum number of delay circuits.

9. The semiconductor integrated circuit device according claim 1, wherein said memory comprises SRAM memory.

* * * * *